(12) United States Patent
Choi et al.

(10) Patent No.: US 7,501,682 B2
(45) Date of Patent: Mar. 10, 2009

(54) NONVOLATILE MEMORY DEVICE, METHOD OF FABRICATING THE SAME, AND ORGANIC LIGHTING EMITTING DIODE DISPLAY DEVICE INCLUDING THE SAME

(75) Inventors: Dae-Chul Choi, Suwon-si (KR); Byoung-Deog Choi, Suwon-si (KR); Hye-Hyang Park, Suwon-si (KR); Ju-Yeun Jung, Suwon-si (KR); Hyun-Sun Park, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/790,010

(22) Filed: Apr. 23, 2007

(65) Prior Publication Data

US 2007/0249110 A1 Oct. 25, 2007

(30) Foreign Application Priority Data

Apr. 24, 2006 (KR) .................. 10-2006-0036852

(51) Int. Cl.
*H01L 29/788* (2006.01)
(52) U.S. Cl. .................................. 257/321; 438/257
(58) Field of Classification Search ............. 438/149, 438/257, 261, 263, 264; 257/314–321, 347, 257/E21.209, E21.422
See application file for complete search history.

(56) References Cited

U.S. PATENT DOCUMENTS

| | | | |
|---|---|---|---|
| 5,108,939 A | 4/1992 | Manley et al. | |
| 5,157,471 A | 10/1992 | Kojima et al. | |
| 5,338,953 A | 8/1994 | Wake | |
| 5,359,218 A | 10/1994 | Taneda | |
| 6,037,221 A | 3/2000 | Lee et al. | |
| 7,038,270 B2 | 5/2006 | Yoo et al. | |
| 7,339,190 B2 * | 3/2008 | Chen et al. ............... | 257/66 |
| 2005/0282338 A1 | 12/2005 | Yoo et al. | |

FOREIGN PATENT DOCUMENTS

| | | |
|---|---|---|
| KR | 93 0007528 B | 8/1993 |
| KR | 95 0011030 B | 9/1995 |
| KR | 96 0011820 B | 8/1996 |
| KR | 98 0135069 B | 4/1998 |
| KR | 10-1998-0013982 A | 5/1998 |
| KR | 10 0231964 B | 12/1999 |
| KR | 10-2003-0086823 A | 11/2003 |
| KR | 10-2005-0120574 A | 12/2005 |

\* cited by examiner

*Primary Examiner*—David Vu
(74) *Attorney, Agent, or Firm*—Lee & Morse, P.C.

(57) ABSTRACT

A nonvolatile memory device may include a substrate, a semiconductor layer on the substrate, and including a source region, a drain region having a relatively shallower impurity injection region than that of the source region and a channel region disposed between the source and drain regions, a first gate insulating layer on the semiconductor layer, and having regions corresponding to the source and drain regions thinner than a region corresponding to the channel region, and a first gate electrode, a second gate insulating layer, and a second gate electrode which are disposed on the first gate insulating layer. An organic light emitting display device (OLED) may include the nonvolatile memory device.

11 Claims, 6 Drawing Sheets

NONVOLATILE MEMORY DEVICE, METHOD OF FABRICATING THE SAME, AND ORGANIC LIGHTING EMITTING DIODE DISPLAY DEVICE INCLUDING THE SAME

BACKGROUND OF THE INVENTION

1. Field of the Invention

The present invention relates to a nonvolatile memory device and an organic lighting emitting diode display device (OLED display device) including the same. More particularly, the present invention relates to a nonvolatile memory device including a semiconductor layer having a drain region which may be shallowly doped compared to a source region, and a tunnel oxide layer which may be thin in regions corresponding to the source and drain regions and thick in a region corresponding to a channel region, a method of fabricating the same, and an OLED display device including the same.

2. Description of the Related Art

In general, memory devices may be divided into two types. One type may be a volatile memory device in which stored data may be erased when power is interrupted. The second type may be a nonvolatile memory device in which the stored data may be maintained even when power is interrupted. A dynamic random access memory (DRAM) and a static random access memory (SRAM) are typical examples of the volatile memory device, and a flash memory is a typical example of the nonvolatile memory device.

A flash memory may be fabricated by sequentially stacking and then etching a tunnel oxide layer, a floating gate, an upper gate insulating layer, and a control gate on a semiconductor substrate.

The floating gate may be isolated between the tunnel oxide layer and the upper gate insulating layer, and the floating gate may store, erase or read information according to a voltage supplied to the control gate.

The flash memory may be formed on a wafer substrate formed of single crystalline silicon which has excellent memory characteristics. However, the flash memory additionally may include a connection apparatus or structure to be combined with another device, e.g., a display device.

During programming, a general flash memory may be easily damaged at an interface between a tunnel oxide layer and a semiconductor layer. During erasing, a relatively higher voltage than in writing or reading may be supplied to a control gate. As a result, flash memory technology which is less liable to damage is desirable for memory devices.

SUMMARY OF THE INVENTION

The present invention is therefore directed to a nonvolatile memory device and a method of fabricating the same which substantially overcomes one or more of the problems due to the limitations and disadvantages of the related art.

It is therefore a feature of an embodiment of the invention to provide an organic lighting emitting diode display device (OLED display device) including a nonvolatile memory device.

At least one of the above and other features of the present invention may be realized by providing a nonvolatile memory device which may include a substrate, a semiconductor layer on the substrate, the semiconductor layer including a source region which may have an impurity injection region, a drain region which may have a shallower impurity injection region than the impurity injection region of the source region, and a channel region between the source and drain regions, a first gate insulating layer on the semiconductor layer, the first gate insulating layer having regions which may correspond to the source and drain regions thinner than a region corresponding to the channel region, and a first gate electrode, a second gate insulating layer, and a second gate electrode which may be on the first gate insulating layer.

The first gate electrode may be a floating gate, and the second gate electrode may be a control gate. The first gate insulating layer may have different thicknesses in the regions corresponding to the source and drain regions. The first gate insulating layer may have a thickness of about 50 to 300 Å, and the second gate insulating layer may have a thickness of about 50 to 1000 Å. The first gate insulating layer may be a silicon oxide layer, and the second gate insulating layer may have a structure of silicon oxide/silicon nitride/silicon oxide (ONO).

At least one of the above and other features of the present invention may be realized by providing an organic light emitting display device (OLED) which may include a substrate, a display region disposed on the substrate, and including a first electrode, an organic layer at least having an organic emission layer and a second electrode, and the nonvolatile memory device may be electrically connected to the first or second electrodes in the display region, the nonvolatile memory device being in a region spaced apart from the display region.

At least one of the above and other features of the present invention may be realized by providing a method of fabricating a nonvolatile memory device which may include providing a substrate, forming a semiconductor layer on the substrate, forming a first insulating layer on the semiconductor layer, forming a photoresist layer on the first insulating layer, forming a first photoresist pattern which may be thick in a region corresponding to a central region and may be thin in regions corresponding to edges of the semiconductor layer utilizing a half-tone mask, etching the first insulating layer using the first photoresist pattern to form a first gate insulating layer which may be thick in a region corresponding to the central region of the semiconductor layer and thin in regions corresponding to the edges of the semiconductor layer, forming a second photoresist pattern exposing one of the edges of the semiconductor layer on the first gate insulating layer, performing a first impurity injection process utilizing the second photoresist pattern as a mask, removing the second photoresist pattern, forming a third photoresist pattern exposing the other of the edges of the semiconductor layer on the first gate insulating layer, performing a second impurity injection process utilizing the third photoresist pattern as a mask, and removing the third photoresist pattern, sequentially forming a first conductive layer, a second insulating layer and a third conductive layer on the substrate, and patterning the layers to form a first gate electrode, a second gate insulating layer and a second gate electrode, respectively.

At least one of the above and other features of the present invention may be realized by providing a method of fabricating a nonvolatile memory device which may include preparing a substrate, forming a semiconductor layer on the substrate, forming a first insulating layer on the semiconductor layer, forming a first photoresist pattern exposing the first insulating layer corresponding to one of both edges of the semiconductor layer on the first insulating layer, etching the first insulating layer to a predetermined depth using the first photoresist pattern as a mask, forming a source region in the semiconductor layer by performing a first impurity injection process, removing the first photoresist pattern, forming a second photoresist exposing the first insulating layer corresponding to the other of both edges of the semiconductor layer on the first insulating layer, etching the first insulating layer to a predetermined depth using the second photoresist pattern as a mask to form a first gate insulating layer, forming a drain region in the semiconductor layer by performing a second impurity injection process, removing the second photoresist pattern, sequentially forming a first conductive layer, a second insulating layer and a second conductive layer on the substrate, and patterning the layers so as to form a first gate electrode, a second gate insulating layer and a second gate electrode, respectively.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
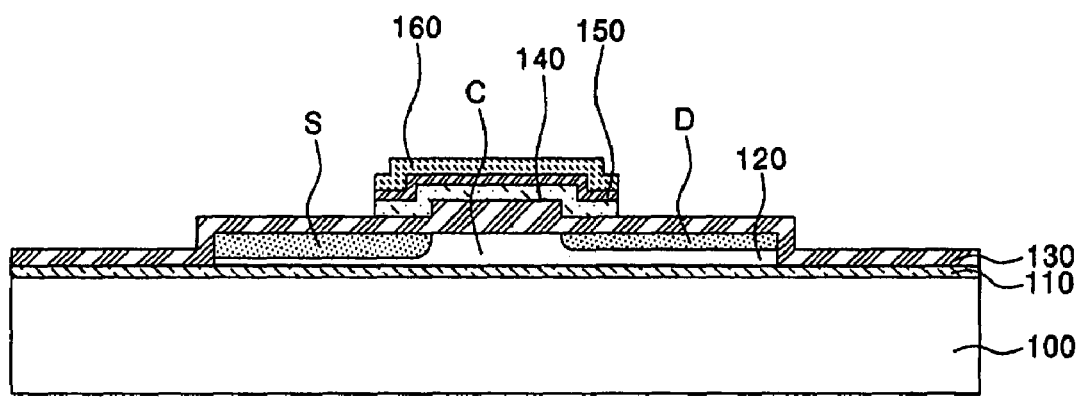
FIG. 1 illustrates a cross-sectional view of a nonvolatile memory device according to an exemplary embodiment of the invention.

Korean Patent Application No. 2006-0036852, filed Apr. 24, 2006, in the Korean Intellectual Property Office, and entitled: "Nonvolatile Memory Device, Method of Fabricating the Same, and Organic Lighting Emitting Diode Display Device Including the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of a nonvolatile memory device according to an exemplary embodiment of the present invention.

Referring to FIG. 1, a buffer layer 110 may be on a transparent insulating substrate 100 that may be formed of, e.g., glass, plastic, etc.

A semiconductor layer 120 including a source region S, a drain region D, and a channel region C may be on a predetermined region of the buffer region 110.

A first gate insulating layer 130 acting as a tunnel oxide layer, a first gate electrode 140 acting as a floating gate, a second gate insulating layer 150 acting as a control oxide layer, and a second gate electrode 160 acting as a control gate may be on the semiconductor layer 120.

The source region S of the semiconductor layer 120 may be injected with impurities, and an impurity injection region of the source region S may be thick in comparison with that of the drain region D. That is, an impurity injection region of the drain region D may be relatively thinner than that of the source region S, so that damage occurring between a junction region of the source region S and the channel region C, and between an interface of the first gate insulating layer 130 and the channel region C, may be reduced during a write, i.e., storage or programming, operation.

The first gate insulating layer 130 may be one of, e.g., a silicon oxide layer, a silicon nitride layer, a stacked layer thereof, etc. The first gate insulating layer 130 may preferably be a silicon oxide layer. The first gate insulating layer 130 may be formed to a thickness of about 50 to 300 Å. When the first gate insulating layer has a thickness less than about 50 Å, the first gate insulating layer 130 may be degraded so fast that the lifespan of the device may be shortened. When the first gate insulating layer has a thickness more than about 300 Å, the movement of electrons may be impeded or prevented, and thus writing efficiency may decrease.

Additionally, the first gate insulating layer 130 may be formed to be thin in regions corresponding to the source and drain region S and D, compared to the channel region C, as illustrated in FIG. 1. The regions of the first gate insulating layer 130 corresponding to the source and drain regions S and D may have different thicknesses.

Since a high voltage may be supplied to the control gate 160 during a write or erase operation, the voltage supplied to the control gate 160 may be influenced by properties of the first gate insulating layer 130, specifically the thickness of a first gate insulating layer 130 close to the source and drain regions S and D. That is, as the first gate insulating layer 130 becomes thinner, the voltage applied during a write or erase operation may become lower.

The second gate insulating layer 150 may serve as a control oxide layer, and thus may be formed to a thickness of about 50 to 1000 Å in consideration of process conditions and insulation characteristics. The second gate insulating layer 150 may be, e.g., a silicon oxide layer, a silicon nitride layer, a stacked layer thereof, etc. Preferably, the second gate insulating layer 150 may have a structure of silicon oxide/silicon nitride/silicon oxide (ONO) or multiple ONO stacks.

Figure 2:
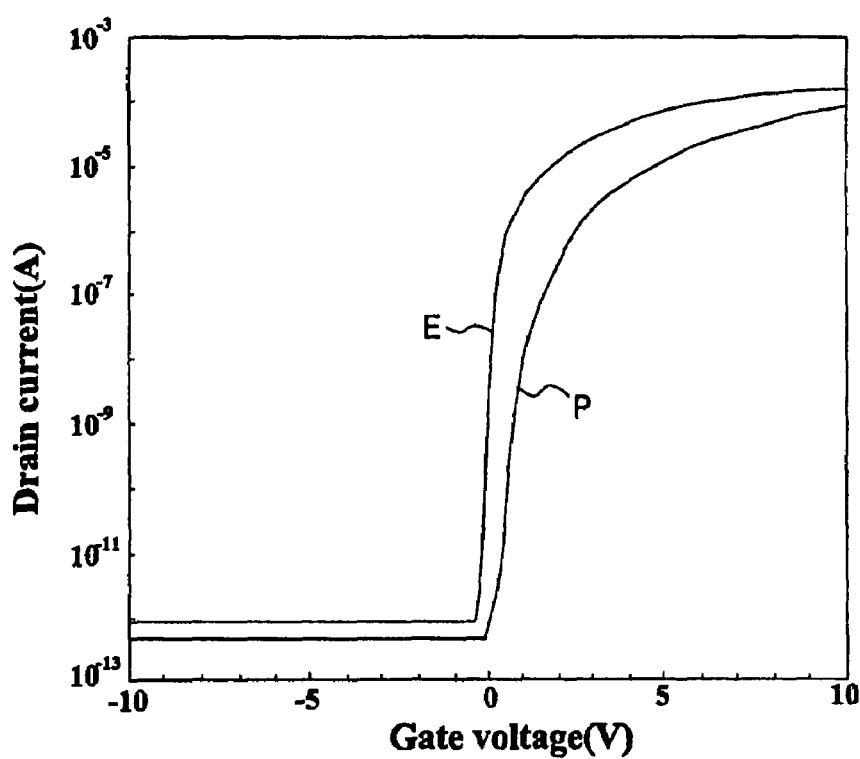
FIG. 2 illustrates a graph showing electrical characteristics of a nonvolatile memory device according to an exemplary embodiment of the present invention.

FIG. 2 illustrates a graph showing electrical characteristics of a nonvolatile memory device according to an exemplary embodiment of the present invention.

Referring to FIG. 2, the I-V plot (P), which indicates the case where information is stored in the nonvolatile memory device, i.e., the case where a write operation may be performed, may be shifted to the right from the I-V plot (E), which indicates the case where no information is stored in the memory device, i.e., an initial state or where an erase operation may be performed.

When the same voltage is applied to a control gate, the case where the nonvolatile memory device stores information may show a lower current value than the case that the nonvolatile memory device stores no information. To obtain the same current value, higher voltage may be applied when the memory device stores information.

Exemplary Embodiment 1

FIGS. 3A to 3F are cross-sectional views illustrating stages of a process of fabricating a nonvolatile memory device according to an exemplary embodiment of the present invention.

Figure 3A:
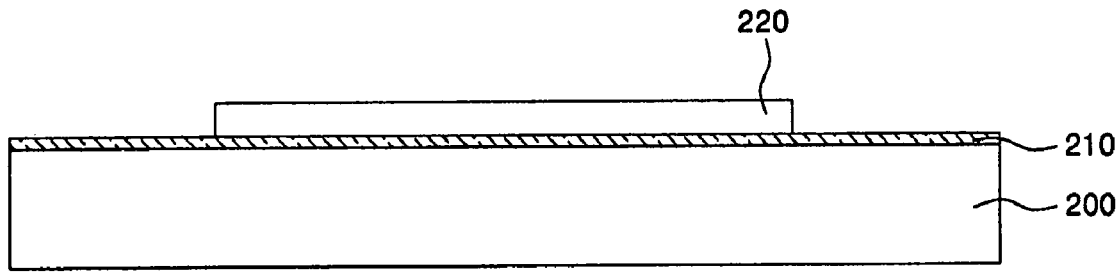
FIGS. 3A to 3F illustrate cross-sectional views of stages of a process of fabricating a nonvolatile memory device according to an exemplary embodiment of the present invention.

Referring to FIG. 3A, a buffer layer 210 may be formed on a transparent insulating substrate 200 formed of, e.g., glass, plastic, etc.

The buffer layer 210 may serve to prevent the diffusion of impurities or moisture impinging from the lower substrate 200, or may serve to control a heat transfer rate so as to allow a semiconductor layer 220 to crystallize smoothly.

Subsequently, an amorphous silicon layer may be formed and crystallized on the buffer layer 210 and then patterned so as to form the semiconductor layer 220.

The amorphous silicon layer may be formed by, e.g., chemical vapor deposition (CVD), physical vapor deposition (PVD), etc. When or after the amorphous silicon layer is formed, it may be dehydrogenated to reduce hydrogen concentration.

To crystallize the amorphous silicon layer, at least one of, e.g., rapid thermal annealing (RTA), solid phase crystallization (SPC), excimer laser crystallization (ELC), metal induced crystallization (MIC), metal induced lateral crystallization (MILC), super grain silicon (SGS) crystallization, and sequential lateral solidification (SLS), etc., may be used.

Figure 3B:
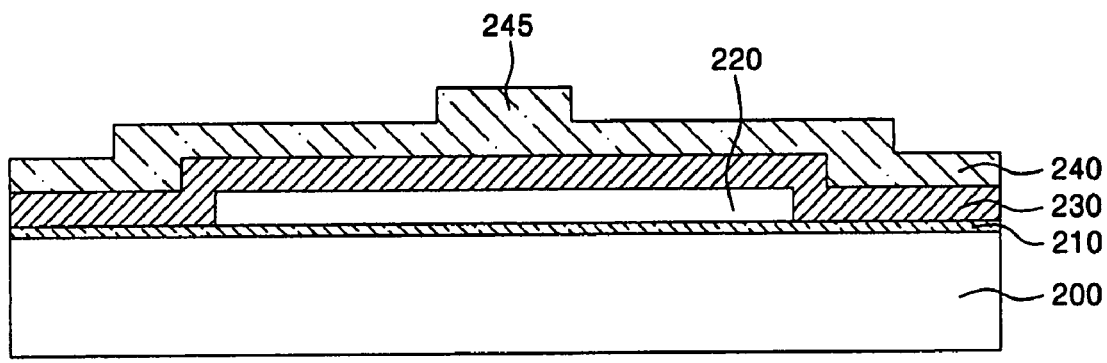

Referring to FIG. 3B, a first insulating layer 230 may be formed on the substrate having the semiconductor layer 220. The first insulating layer 230 may be, e.g., a silicon oxide layer, a silicon nitride layer, a stacked layer thereof, etc.

Then, a photoresist layer may be formed on the first insulating layer 230, and a first photoresist pattern 240 may be formed by performing an exposing process using a partial shielding mask (not shown), i.e., a half-tone mask. A central region 245 of the first photoresist pattern 240 corresponding to the center of the semiconductor layer 220, i.e., a region where a channel region will be formed, may be formed thicker than edges of the semiconductor layer 220, i.e., regions where source and drain regions will be formed.

The first photoresist pattern 240 in a region in which the semiconductor layer 220 may not be formed may be as thick as the central region 245, may not be formed and expose the first insulating layer 230, or may have the same thickness as the edges, as illustrated in FIG. 3B.

To form the first photoresist pattern 240 having the thick central region 245, the photoresist layer may be formed on the first insulating layer 230 using a method such as, e.g., spin coating, and then a half-tone mask having a full shielding part, a partial shielding part and an open part may be aligned on the substrate. The half-tone mask may be aligned so that the full shielding part may be disposed on a region in which the central region 245 will be formed.

When exposure and development are finished, the photoresist layer corresponding to the full shielding part or the open part may be formed into the photoresist pattern 240, which may be thinner at the edges and thicker at the central region 245.

Figure 3C:
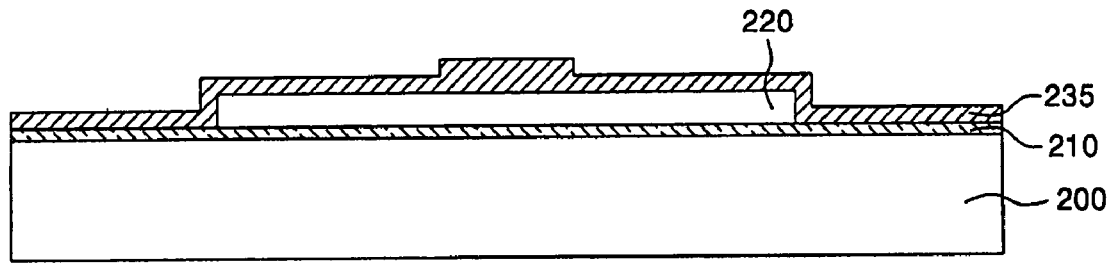

Referring to FIG. 3C, when the first photoresist pattern 240 starts to be etched, the first insulating layers 230 under the thin edges of the first photoresist pattern 240 (that is, regions corresponding to the source and drain regions of the semiconductor layer 220) may be first exposed and etched, but the first insulating layer 230 under the thick central region 245 may not be exposed and etched, or may be exposed later and etched less. Wet or dry etching techniques may be used. When the etching process is finished, the remaining first photoresist pattern 240 may be removed.

By the above-described etching process, a first gate insulating layer 235 may be formed to be thick in the region corresponding to the channel region of the semiconductor layer 220, and the first gate insulating layer 235 may be formed to be thin in the regions corresponding to the source and drain regions of the semiconductor region 220.

Figure 3D:
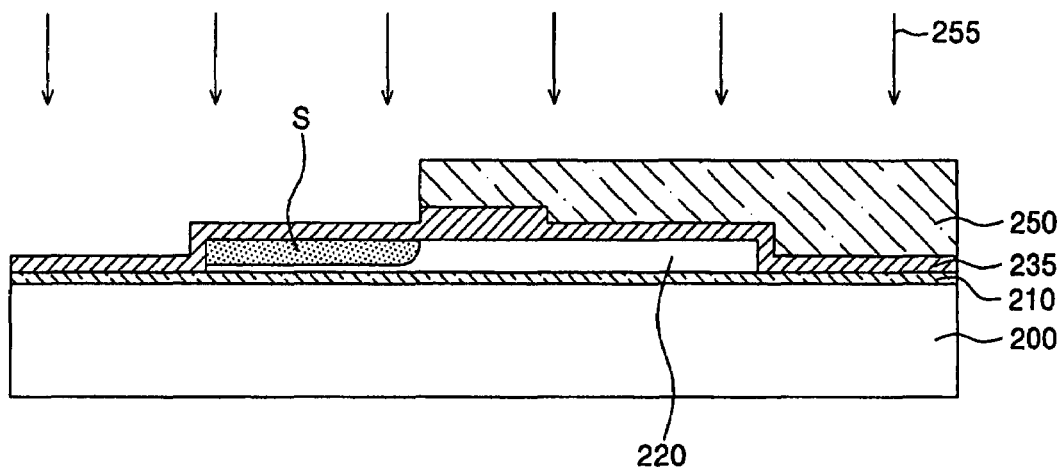

Referring to FIG. 3D, a second photoresist pattern 250 which covers the central region and any one of the edges of the semiconductor layer 220 may be formed on the substrate having the semiconductor layer 220 and first gate insulating layer 235.

Subsequently, a first impurity-injection process 255 may be performed on the substrate having the second photoresist pattern 250 to form a source region S. Then, the second photoresist pattern 250 may be removed.

Figure 3E:
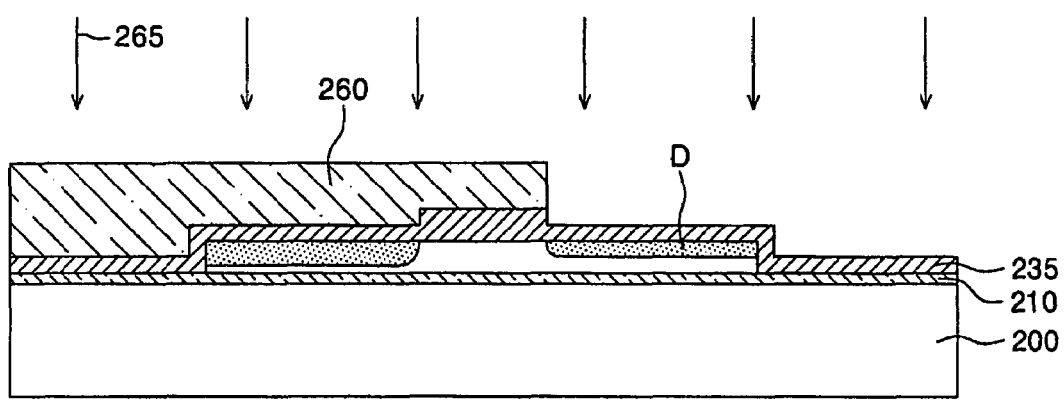

Referring to FIG. 3E, a third photoresist pattern 260, which may cover the central region of the semiconductor layer 220 and the source region S of the edges of the semiconductor layer 220, may be formed on the substrate having the semiconductor layer 220 and first gate insulating layer 235.

Subsequently, a second impurity-injection process 265 may be performed on the substrate having the third photoresist pattern 260 to form a drain region D.

Then, the third photoresist pattern 260 may be removed. Then, the third photoresist pattern 260 may be removed.

The first and second impurity-injection processes 255 and 265 may be performed to inject impurities deeply into the source region S compared to the drain region D by controlling at least one of injection energy, impurity concentration, and impurity type. If necessary, different types of impurities may be injected into the source and drain regions S and D, respectively.

Figure 3F:
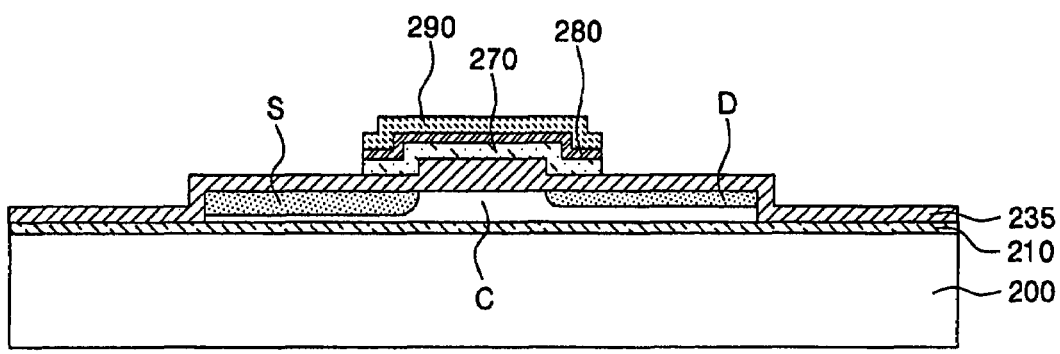

Referring to FIG. 3F, a first conductive layer, a second insulating layer, and a second conductive layer may be sequentially stacked on the gate insulating layer 235 and then patterned so as to form a first gate electrode 270, a second gate insulating layer 280, and a second gate electrode 290, respectively.

Here, the first gate insulating layer 235 may be a tunnel oxide layer, the first gate electrode 270 may be a floating gate, the second gate insulating layer 280 may be a control oxide layer, and the second gate electrode 290 may be a control gate.

Additionally, the second gate insulating layer 280, which may be the control oxide layer, may be, e.g., a silicon oxide layer, a silicon nitride layer, a stacked layer thereof, etc. Preferably, the second gate insulating layer 280 may have a structure of silicon oxide/silicon nitride/silicon oxide (ONO) structure. The second gate insulating layer 280 may also be a stack of ONO structures.

Exemplary Embodiment 2

FIGS. 4A to 4E illustrate cross-sectional views of stages of a process of fabricating a nonvolatile memory device according to another exemplary embodiment of the present invention.

Figure 4A:
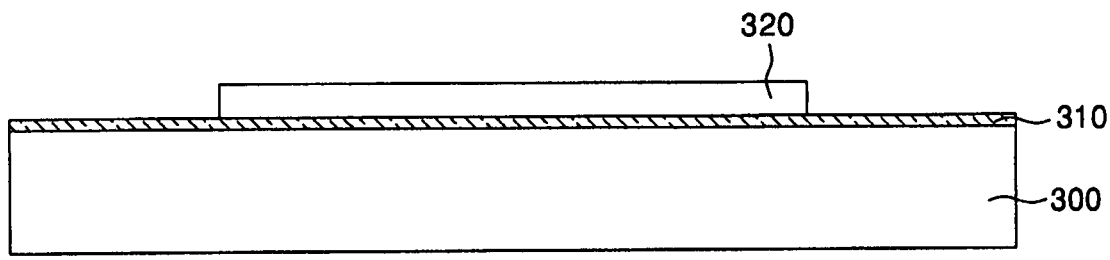
FIGS. 4A to 4E illustrate cross-sectional views of stages of a process of fabricating a nonvolatile memory device according to another exemplary embodiment of the present invention.

Referring to FIG. 4A, a buffer layer 310 may be formed on a transparent insulating substrate 300 formed of, e.g., glass, plastic, etc.

The buffer layer 310 may serve to prevent the diffusion of impurities or moisture impinging or diffusing from the substrate 300, or may serve to control a heat transfer rate in crystallization to allow smooth crystallization of a semiconductor layer 320.

An amorphous silicon layer may be formed on the buffer layer 310 and then patterned to form the semiconductor layer 320. The amorphous silicon layer may be formed by, e.g., CVD, PVD, etc. When or after the amorphous silicon layer is formed, a dehydrogenation process may be performed to reduce hydrogen concentration. To crystallize the amorphous silicon layer, at least one of RTA, SPC, ELC, MIC, MILC and SLS may be used.

Figure 4B:
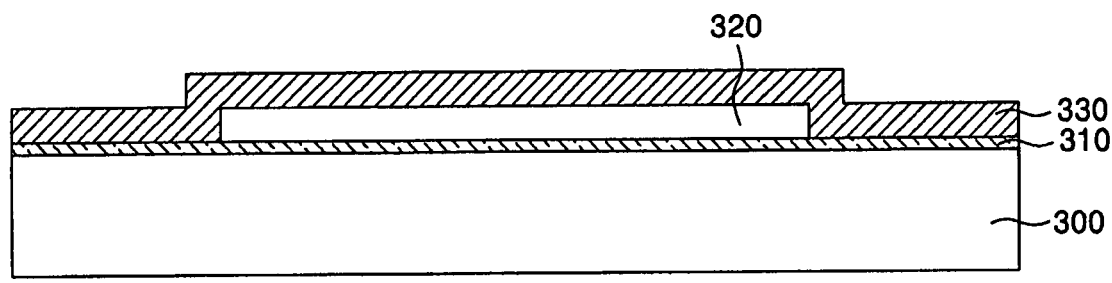

Referring to FIG. 4B, a first insulating layer 330 may be formed on the substrate having the semiconductor layer 320. The first insulating layer 330 may cover the semiconductor layer 320.

The first insulating layer 330 may be one of, e.g., a silicon oxide layer, a silicon nitride layer, a stacked layer thereof, etc.

Figure 4C:
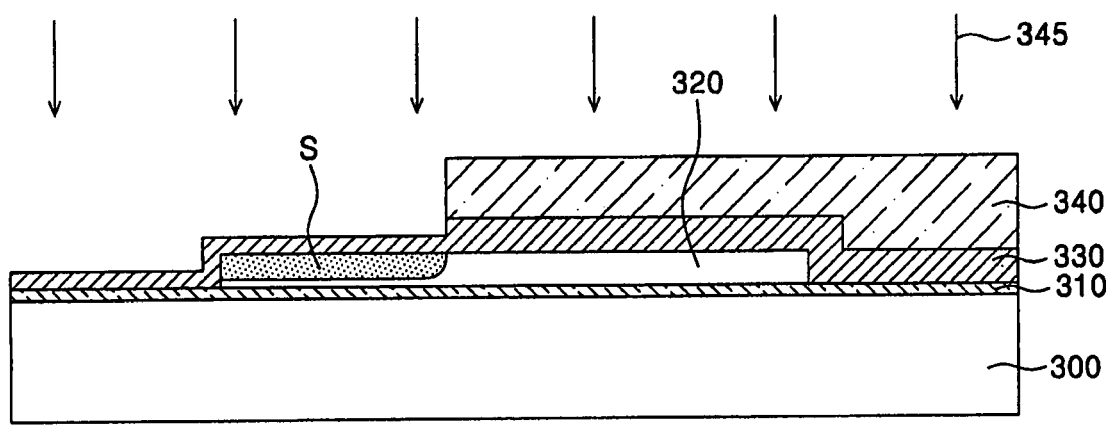

Referring to FIG. 4C, a photoresist layer may be formed on the substrate having the first insulating layer 330 by using, e.g., a spin coating method. The photoresist layer may then be exposed and developed so as to form a fourth photoresist pattern 340 exposing a predetermined region of the first insulating layer 330, which may correspond to one region of both edges of the semiconductor layer 320.

The first insulating layer 330 may be etched to a predetermined depth using the fourth photoresist pattern 340 as a mask.

Subsequently, a third impurity injection process 345 may be performed on the semiconductor layer 320 to form a source region S. Here, the third impurity injection process 345 may be the same process as the first impurity injection process of FIG. 3D. Then, the fourth photoresist pattern 340 may be removed.

Figure 4D:
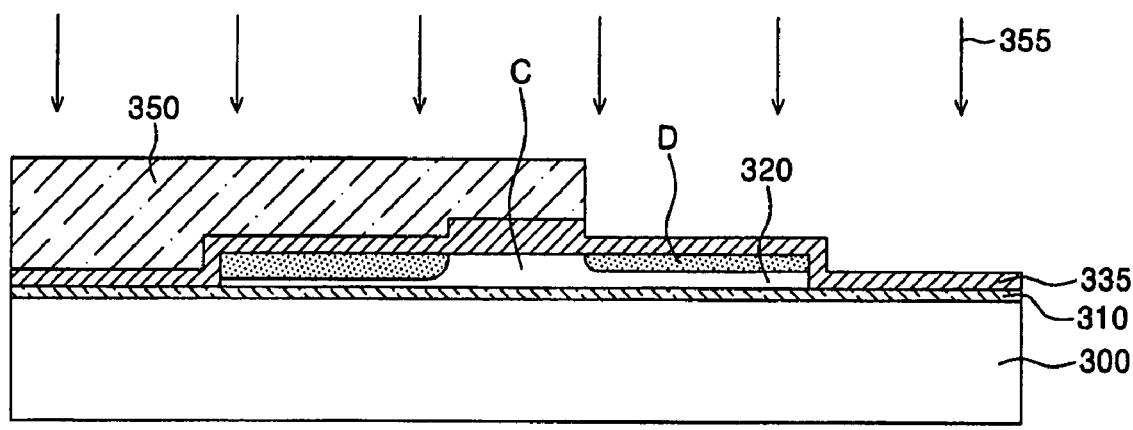

Referring to FIG. 4D, a photoresist layer may be formed on the substrate using, e.g., a spin coating method. The photoresist layer may then be exposed and developed to form a fifth photoresist pattern 350 exposing a predetermined region of the first insulating layer 330 corresponding to a predetermined region in the edge opposite to the source region S of the semiconductor layer 320.

Subsequently, the first insulating layer 330 may be etched to a predetermined depth using the fifth photoresist pattern 350 as a mask, and then a drain region D having a shallower impurity injection depth than the source region S may be formed by performing a fourth impurity injection process 355. Here, the fourth impurity injection process 355 may be the same process as the second impurity injection process of FIG. 3E.

A channel region C may be subsequently formed between the source and drain regions S and D. Then, the fifth photoresist pattern 350 may be removed.

The first insulating layer 330 may be etched to a predetermined depth using the fourth and fifth photoresist patterns 340 and 350 as masks so as to form a first gate insulating layer 335 in which regions corresponding to the source and drain regions S and D are thinner than a region corresponding to the channel region, i.e., the region between the source and drain regions S and D, of the semiconductor layer 320.

The first gate insulating layer 335 may be formed by etching the first insulating layer 330 to different depths using the fourth and fifth photoresist patterns 340 and 350. The first gate insulating layer 335 may thus have different thicknesses in the regions corresponding to the source and drain regions S and D.

Figure 4E:
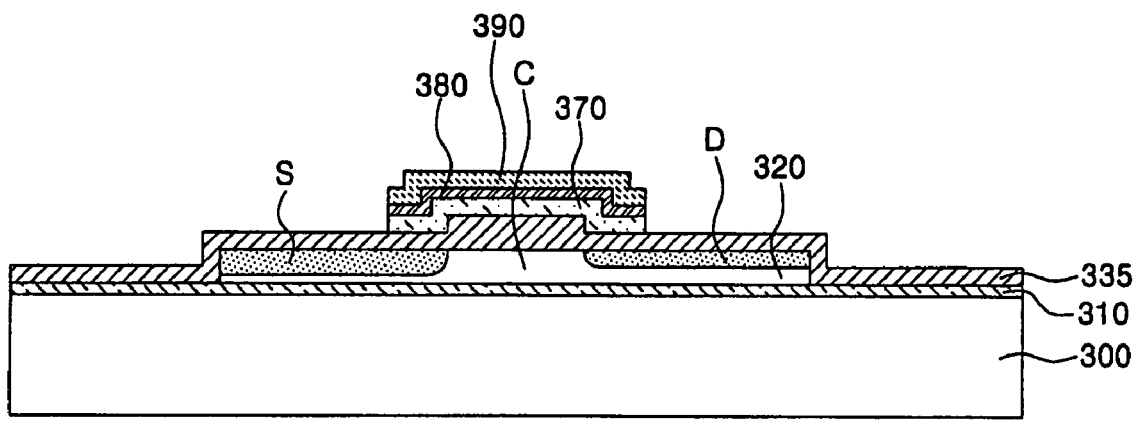

Referring to FIG. 4E, a first conductive layer, a second insulating layer, and a second conductive layer may be sequentially stacked on the gate insulating layer 335 and then patterned to form a first gate electrode 370, a second gate insulating layer 380, and a second gate electrode 390, respectively.

Here, the first gate insulating layer 335 may be a tunnel oxide layer, the first gate electrode 370 may be a floating gate, the second gate insulating layer 380 may be a control oxide layer, and the second gate electrode 390 may be a control gate.

The second gate insulating layer 380, which may be the control oxide layer, may be one of, e.g., a silicon oxide layer, a silicon nitride layer, a stacked layer thereof, etc. Preferably, the second gate insulating layer 380 may have a structure of silicon oxide/silicon nitride/silicon oxide (ONO). The second gate insulating layer 380 may also be a stack of ONO structures.

Figure 5:
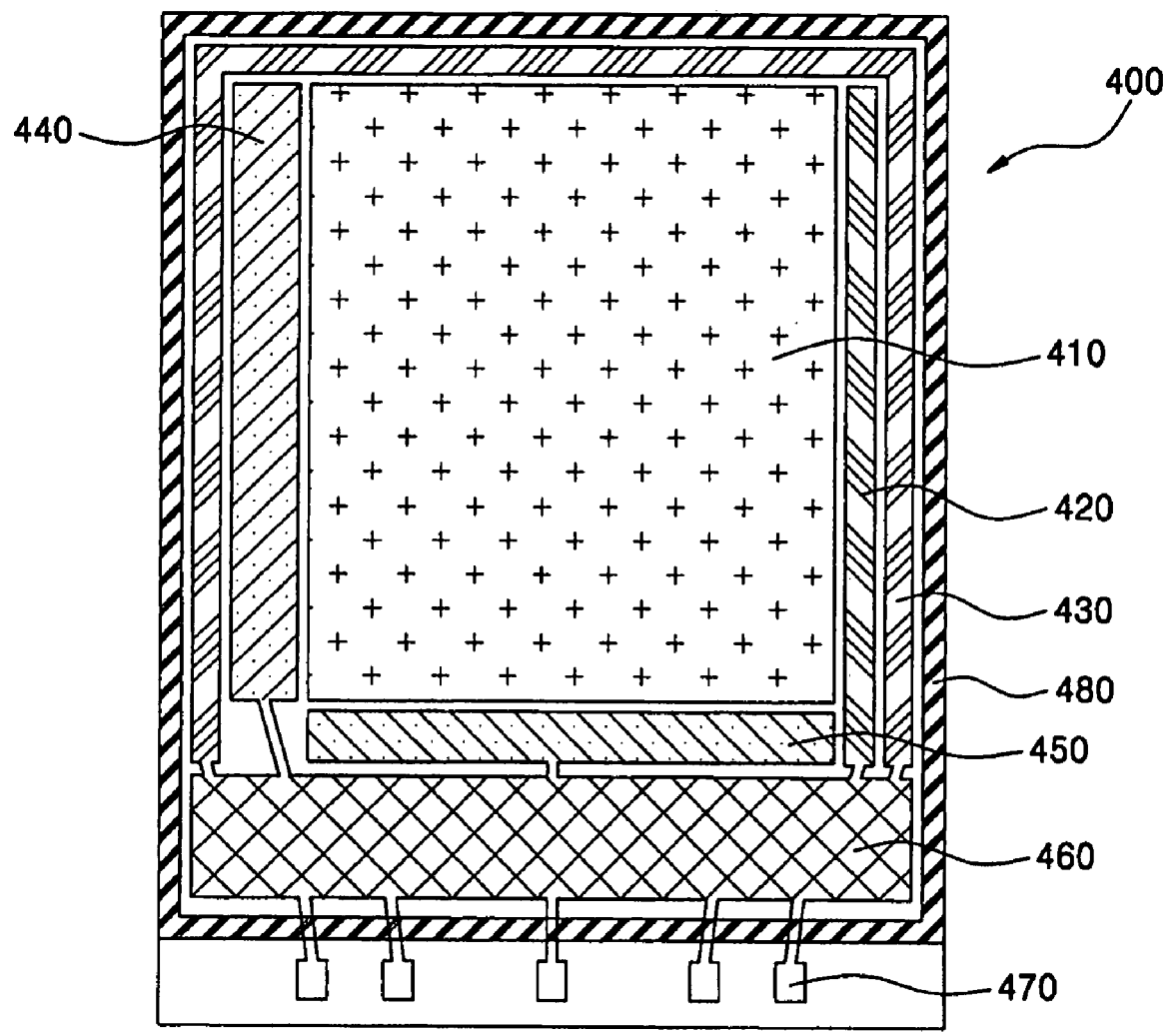
FIG. 5 illustrates a plan view of an organic light emitting display device (OLED) including a nonvolatile memory device according to an exemplary embodiment of the present invention.

FIG. 5 illustrates a plan view of an organic lighting emitting diode display device (OLED display device) which may include a nonvolatile memory device according to an exemplary embodiment of the present invention.

Referring to FIG. 5, a display region 410, including a first electrode, an organic layer having at least an organic emission layer, and a second electrode, may be formed on a transparent insulating substrate 400 which may be composed of, e.g., glass, plastic, etc.

At the periphery of the display region 410 may be found a cathode bus line 420, a common power bus line 430 for applying power to the display region 410, a scan driver 440, and a data driver 450 for supplying a signal to the display region 410.

A memory region 460 having a nonvolatile memory, e.g., a flash memory, connected with the cathode bus line 420, the common power bus line 430, the scan driver 440 and the data driver 450 may be disposed at the periphery of the display region.

Pads 470, i.e., contact parts, may be disposed farthest from the display region 410 to provide signals or power from an external device to the cathode bus line 420, the common power bus line 430, the scan driver 440, the data driver 450 or the memory region 460.

A sealing part 480 may surround the display region 410, the cathode bus line 420, the common power bus line 430, the scan driver 440, the data driver 450, and the memory region 460. The sealing part 480 may dispose on the edge of the substrate to encapsulate the substrate with an encapsulation substrate (not shown in the drawing).

A nonvolatile memory device may be in the memory region 460. The OLED display may include the display region 410, the cathode bus line 420, the common power bus line 450, the scan driver 440 and the data driver 450, and the pads 470, so that it may be possible to store power or signals input through the pads 470. Signals stored in the nonvolatile memory device may be transmitted by the power or signals input through the pads 470 to a thin film transistor, a first electrode or a second electrode in the display region 410 through the cathode bus line 420, the common power bus line 430, the scan driver 440 and the data driver 450, which are electrically connected to each other.

In a nonvolatile memory device and an OLED display device according to an embodiment of the present invention, it may be possible to directly implement the nonvolatile memory device in a flat panel display and also facilitate write and erase operations.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A nonvolatile memory device, comprising:
   a substrate;
   a semiconductor layer on the substrate, the semiconductor layer including a source region having an impurity injection region, a drain region having a shallower impurity injection region than the impurity injection region of the source region, and a channel region between the source and drain regions;
   a first gate insulating layer on the semiconductor layer, the first gate insulating layer having regions corresponding to the source and drain regions thinner than a region corresponding to the channel region; and
   a first gate electrode, a second gate insulating layer, and a second gate electrode on the first gate insulating layer.

2. The device as claimed in claim 1, wherein the semiconductor layer is a polycrystalline silicon layer formed by at least one crystallization method selected from rapid thermal annealing, solid phase crystallization, excimer laser crystallization, metal induced crystallization, metal induced lateral crystallization, super grain silicon crystallization, or sequential lateral solidification.

3. The device as claimed in claim 1, wherein the first gate electrode is a floating gate, and the second gate electrode is a control gate.

4. The device as claimed in claim 1, wherein the first gate insulating layer has different thicknesses in the regions corresponding to the source and drain regions.

5. The device as claimed in claim 1, wherein the first gate insulating layer has a thickness of about 50 to 300 Å, and the second gate insulating layer has a thickness of about 50 to 1000 Å.

6. The device as claimed in claim 1, wherein the first gate insulating layer is a silicon oxide layer, and the second gate insulating layer has a structure of silicon oxide/silicon nitride/silicon oxide.

7. An organic light emitting display device (OLED), comprising:
   a substrate;
   a display region disposed on the substrate, and including a first electrode, an organic layer at least having an organic emission layer and a second electrode; and
   a nonvolatile memory device electrically connected to the first or second electrodes in the display region, the nonvolatile memory device being in a region spaced apart from the display region,
   wherein the nonvolatile memory device comprises:
   the semiconductor layer including a source region having an impurity injection region, a drain region having a shallower impurity injection region than the impurity injection region of the source region, and a channel region between the source and drain regions;
   a first gate insulating layer on the semiconductor layer, the first gate insulating layer having regions corresponding to the source and drain regions thinner than a region corresponding to the channel region; and
   a first gate electrode, a second gate insulating layer, and a second gate electrode on the first gate insulating layer.

8. The OLED as claimed in claim 7, wherein the first gate electrode is a floating gate, and the second gate electrode is a control gate.

9. The OLED as claimed in claim 7, wherein the first gate insulating layer has different thicknesses in the regions corresponding to the source and drain regions.

10. The OLED as claimed in claim 7, wherein the first gate insulating layer has a thickness of about 50 to 300 Å, and the second gate insulating layer has a thickness of about 50 to 1000 Å.

11. The OLED as claimed in claim 7, wherein the first gate insulating layer is a silicon oxide layer, and the second gate insulating layer has a structure of silicon oxide/silicon nitride/silicon oxide.

* * * * *